(12) United States Patent
Ferianz

(10) Patent No.: US 7,005,895 B2
(45) Date of Patent: Feb. 28, 2006

(54) DRIVER CIRCUIT WITH FREQUENCY-DEPENDENT SIGNAL FEEDBACK

(75) Inventor: Thomas Ferianz, Glanegg (AT)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 10/674,119

(22) Filed: Sep. 26, 2003

(65) Prior Publication Data

US 2005/0099212 A1  May 12, 2005

(30) Foreign Application Priority Data

Oct. 15, 2002  (DE)  ................................ 102 48 149

(51) Int. Cl.
  *H03B 1/00*  (2006.01)
(52) U.S. Cl. .................................................... 327/108
(58) Field of Classification Search ................. 327/52, 327/54, 67, 73, 89, 108, 561, 337, 344, 345, 327/554; 330/260, 265, 270–271, 282, 291, 330/298
See application file for complete search history.

(56) References Cited

U.S. PATENT DOCUMENTS

| 4,390,844 A | * | 6/1983 | Ting ............................ 327/345 |
| 5,317,277 A | * | 5/1994 | Cavigelli ..................... 330/109 |
| 5,650,652 A | * | 7/1997 | Mizutani et al. ............ 257/355 |
| 6,522,179 B1 | * | 2/2003 | Ferianz ........................ 327/108 |
| 6,683,498 B1 | * | 1/2004 | Burns et al. ................. 330/261 |
| 6,771,119 B1 | * | 8/2004 | Ochi .......................... 327/552 |

FOREIGN PATENT DOCUMENTS

DE  10045720 A1  4/2002

OTHER PUBLICATIONS

Tietze, U.; Schenk, Ch.: Halbleiter-Schaltungstechnik, 11. Aufl., Berlin [u.a.]: Springer, 1999, S. 520-523, ISBN 3-540-64192-0.

* cited by examiner

*Primary Examiner*—My-Trang Nu Ton
(74) *Attorney, Agent, or Firm*—Jenkins, Wilson & Taylor, P.A.

(57) ABSTRACT

Driver circuit for driving a useful signal having: (a) at least one amplifier circuit (3a, 3b) with low output impedance for the signal amplification of the useful signal; (b) a protection impedance (9a, 9b) respectively connected downstream of the amplifier circuit (3a, 3b) and serving to protect the amplifier circuit (3a, 3b); characterized in that (c) provision is respectively made of a feedback circuit (14a, 14b) for the frequency-dependent signal feedback of the useful signal amplified by the amplifier circuit (3a, 3b).

7 Claims, 6 Drawing Sheets

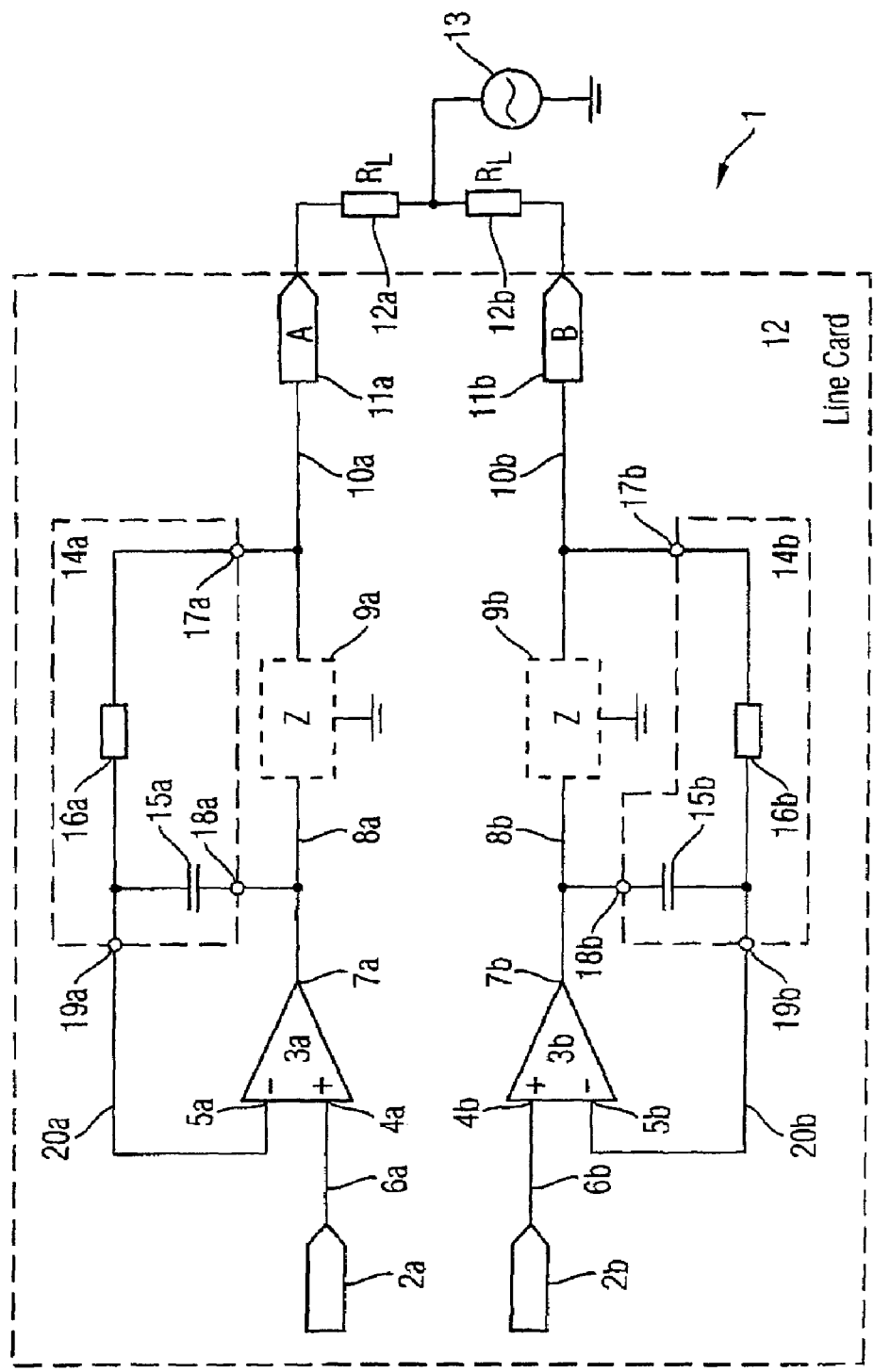

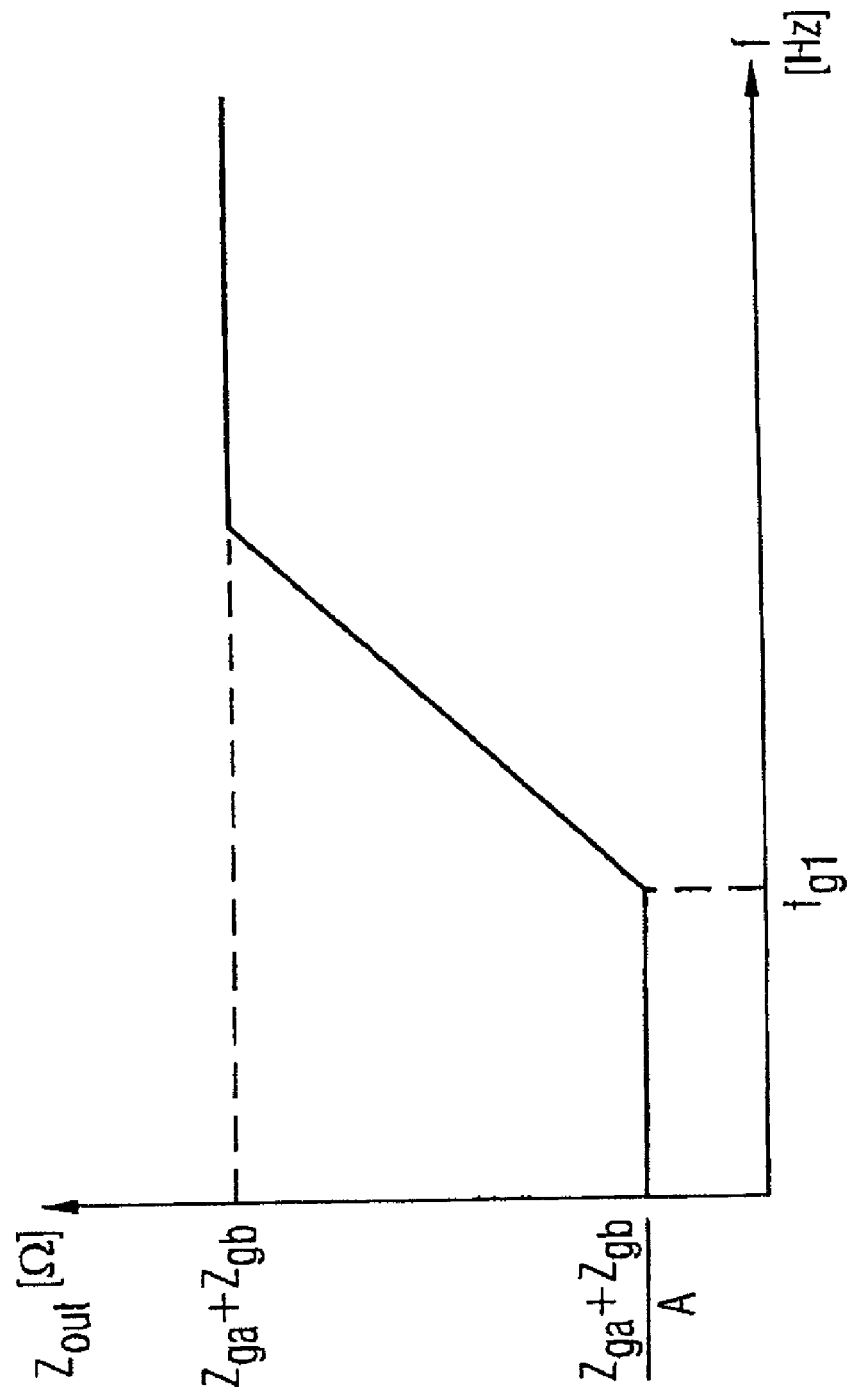

DRIVER CIRCUIT WITH FREQUENCY-DEPENDENT SIGNAL FEEDBACK

TECHNICAL FIELD

The invention relates to a driver circuit for driving a useful signal in accordance with the preamble of Patent claim 1.

BACKGROUND ART

FIG. 1 shows a driver circuit according to the prior art for driving a useful signal.

The driver circuit illustrated in FIG. 1 is of differential construction and contains two operational amplifiers OPA, OPB for signal amplification. The operational amplifiers amplify a useful signal arriving from a signal source and output the amplified useful signal via protection impedances $Z_a$, $Z_b$ to a connected terminal, for example a telephone T. The operational amplifiers are integrated for example in an SLIC circuit situated on a line card. The operational amplifiers each have a low output impedance for the signal amplification of the useful signal. The impedances connected downstream of the two operational amplifiers serve to protect the amplifier circuits and for electromagnetic compatibility (EMC). The output impedances $Z_a$, $Z_b$ preferably protect the amplifier circuit from overvoltages, which may be caused by a flash of lightning, for example, and for the suppression of interference signals, for example radio signals.

FIGS. 2a to 2c show practical realizations of the protection impedances $Z_a$, $Z_b$ according to the prior art.

The driver circuit illustrated in FIG. 1 is of differential construction, the components being symmetrical, i.e. in particular the two protection impedances $Z_a$, $Z_b$ are as far as possible of identical construction in order to have a maximum longitudinal conversion loss. In communication systems, for example appertaining to voice telephony, the driver circuit for driving the useful signal must satisfy very stringent circuitry requirements with regard to the longitudinal conversion loss LCL. The standards relevant to the longitudinal conversion loss are the TR57 standard in the USA and the Q552 and G712 standards in Europe.

FIG. 3 shows a measuring circuit for determining the longitudinal conversion loss LCL.

FIG. 4 shows an associated equivalent circuit diagram. The output impedance $Z_{out}$ illustrated in the equivalent circuit diagram is the output impedance of the overall circuit to the left of the output pads Outa, Outb for the SLIC circuit in FIG. 1. The measuring circuit illustrated in FIG. 3 serves for measuring the longitudinal conversion loss LCL. A signal source feeds a sinusoidal measurement signal into the two output pads A, B of the line card via feed-in resistors $R_L$. The two measuring resistors $R_L$ are high-precision resistors with matching resistances. The voltage between the two output pads A, B is measured.

The following holds true for the longitudinal conversion loss:

$$LCL = 20 \cdot \log \left| \frac{V_L}{V_T} \right| \quad (1)$$

The following relationship holds true between the longitudinal conversion loss LCL and the impedances illustrated in the equivalent circuit diagram according to FIG. 4:

$$LCL = 20 \cdot \log \left| \frac{1}{\frac{Z_{out} + \Delta Z}{R_L + Z_{out} + \Delta Z} - \frac{Z_{out}}{R_L + Z_{out}}} \right| \quad (2)$$

The high-precision feed-in resistors $R_L$ have a value of 300 ohms, for example. The impedance difference $\Delta Z$ between the output impedances exists because of manufacturing tolerances and inaccuracies of the protection impedances $Z_a$, $Z_b$ in the conventional driver circuit as illustrated in FIG. 1.

With the applicable condition $\Delta Z \ll R_L$, equation (2) can be greatly simplified to:

$$LCL \cong 20 \cdot \log \left| \frac{R_L + Z_{out}}{\Delta Z} \right| \quad (3)$$

To ensure that the longitudinal conversion loss is as high as possible and LCL thus assumes a maximum value, conventional driver circuits have hitherto used expensive output impedances with high accuracy, i.e. impedances which have very small tolerances during production. Such components which have to satisfy very high accuracy requirements can only be produced with considerable technical outlay and high costs.

SUMMARY OF THE INVENTION

Therefore, the object of the present invention is to provide a driver circuit which, with the use of components with relatively large manufacturing tolerances, nevertheless ensures a very high longitudinal conversion loss LCL.

This object is achieved according to the invention by means of a driver circuit having the features specified in Patent claim 1.

The invention provides a driver circuit for driving a useful signal having at least one amplifier circuit with low output impedance for the signal amplification of the useful signal, a protection impedance respectively connected downstream of the amplifier circuit and serving to protect the amplifier circuit, provision respectively being made of a feedback circuit for the frequency-dependent signal feedback of the useful signal amplified by the amplifier circuit.

The amplifier circuit is preferably an operational amplifier having an inverting signal input, a noninverting signal input and a signal output.

The protection impedance is preferably connected between the signal output of the operational amplifier and a signal line connection for the connection of a signal line.

The signal line is preferably a telephone line for connecting a telephone to the driver circuit.

The driver circuit is preferably of differential construction and has two symmetrically constructed amplifier circuits, two symmetrical protection impedances and two symmetrically constructed signal feedback circuits being provided.

The signal feedback circuits preferably respectively contain a capacitor, which is connected between the signal output of the operational amplifier and a signal input of the operational amplifier, and also a resistor, which is connected between the signal line connection and a further signal input of the operational amplifier.

The signal feedback circuit feeds back high-frequency signal components of the useful signal amplified by the amplifier circuit to the signal input of the amplifier circuit to a greater extent than low-frequency signal components of the useful signal amplified by the amplifier circuit, so that the output impedance of the driver circuit is reduced in a specific first frequency range up to a first predetermined limiting frequency ($f_{G1}$) which lies above the second limiting frequency ($f_{G2}$) of the useful signal.

In this case, the first frequency range comprises a second frequency range preferably provided for the transmission of a useful signal.

The second frequency range is preferably the voice signal band for the transmission of a telephone voice signal.

In this case, the limiting frequency ($f_{g2}$) of the useful signal is preferably about 4 kHz.

Preferred embodiments of the driver circuit according to the invention are described below with reference to the accompanying drawings in order to elucidate features that are essential to the invention.

In the figures:

FIG. 5 shows a preferred embodiment of the driver circuit according to the invention for driving a useful signal;

FIG. 6 [sic] shows a diagram illustrating the output impedance of the driver circuit according to the invention as a function of the frequency.

DETAILED DESCRIPTION OF THE INVENTION

A preferred embodiment of the driver circuit according to the invention for driving a useful signal is explained in detail below with reference to FIG. 5. The driver circuit 1 as illustrated in FIG. 5 serves for driving a useful signal, for example a voice signal for the transmission of an analog voice signal to a telephone terminal.

Figure 1:
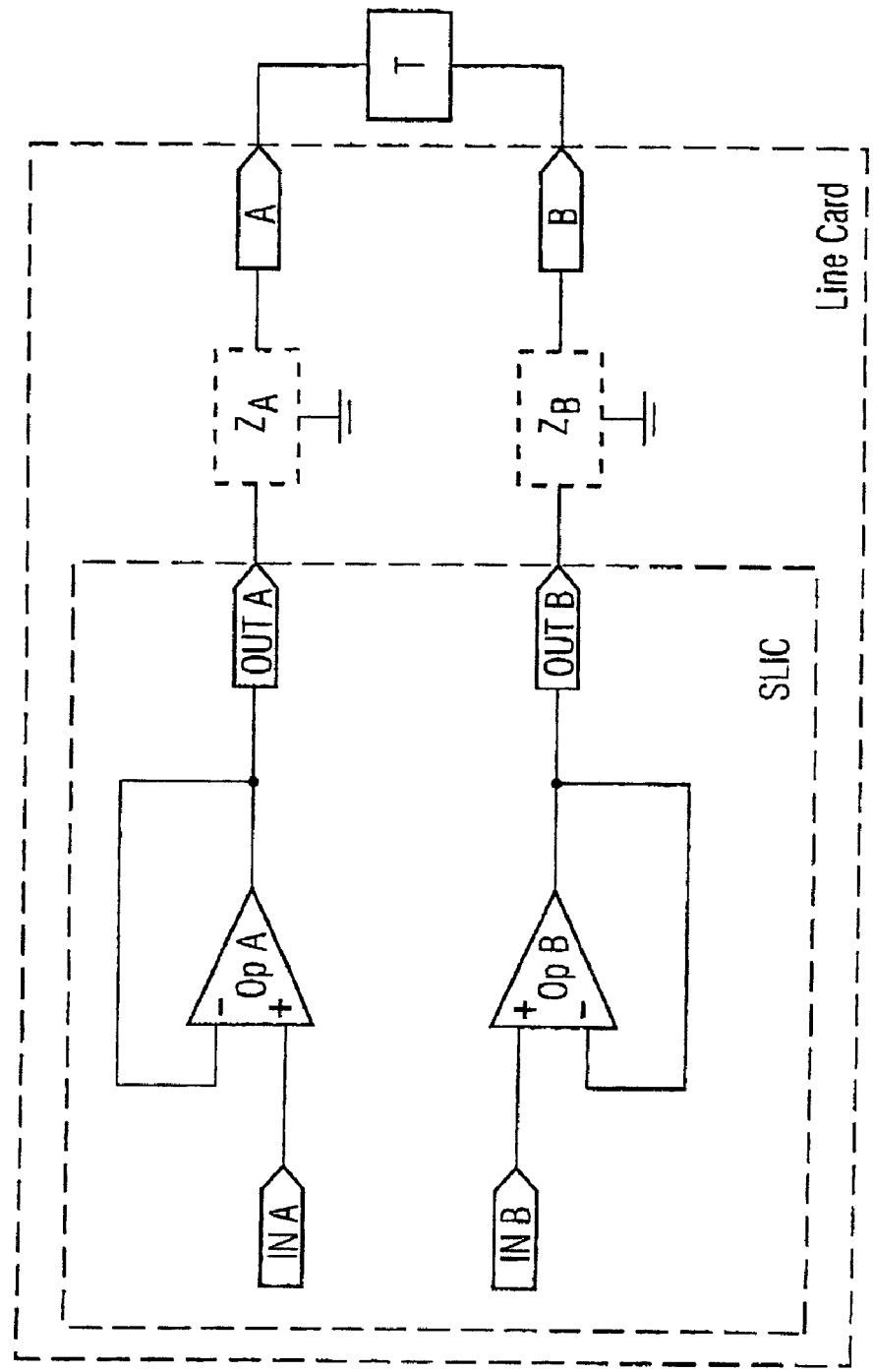
FIG. 1 shows a driver circuit for driving a useful signal according to the prior art.
Figure 2A:
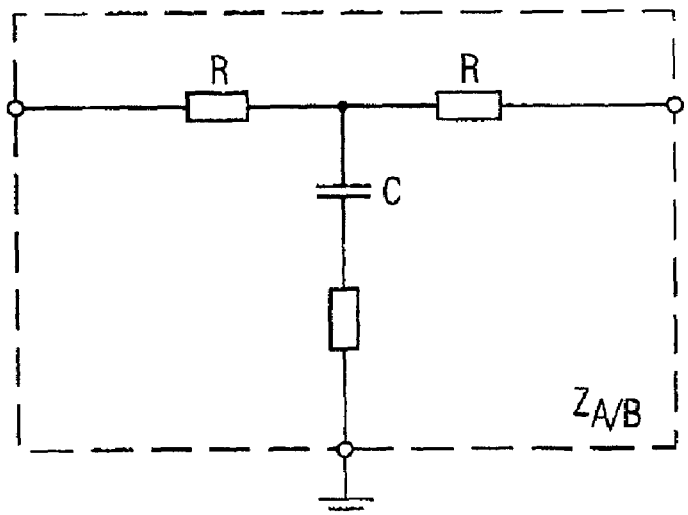
FIG. 2 shows various embodiments of protection impedances for protecting the amplifier circuits according to the prior art.
Figure 2B:
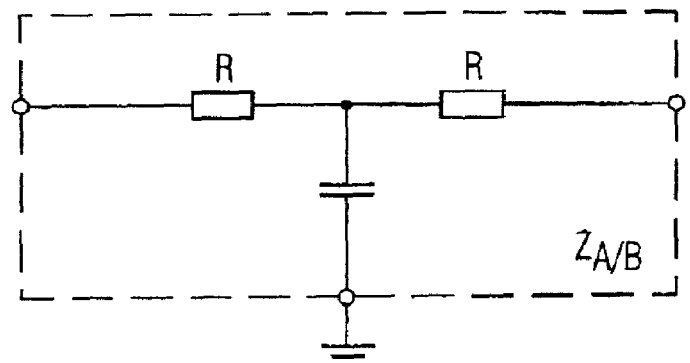
Figure 2C:
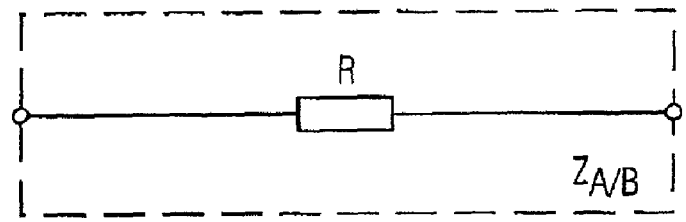
Figure 3:
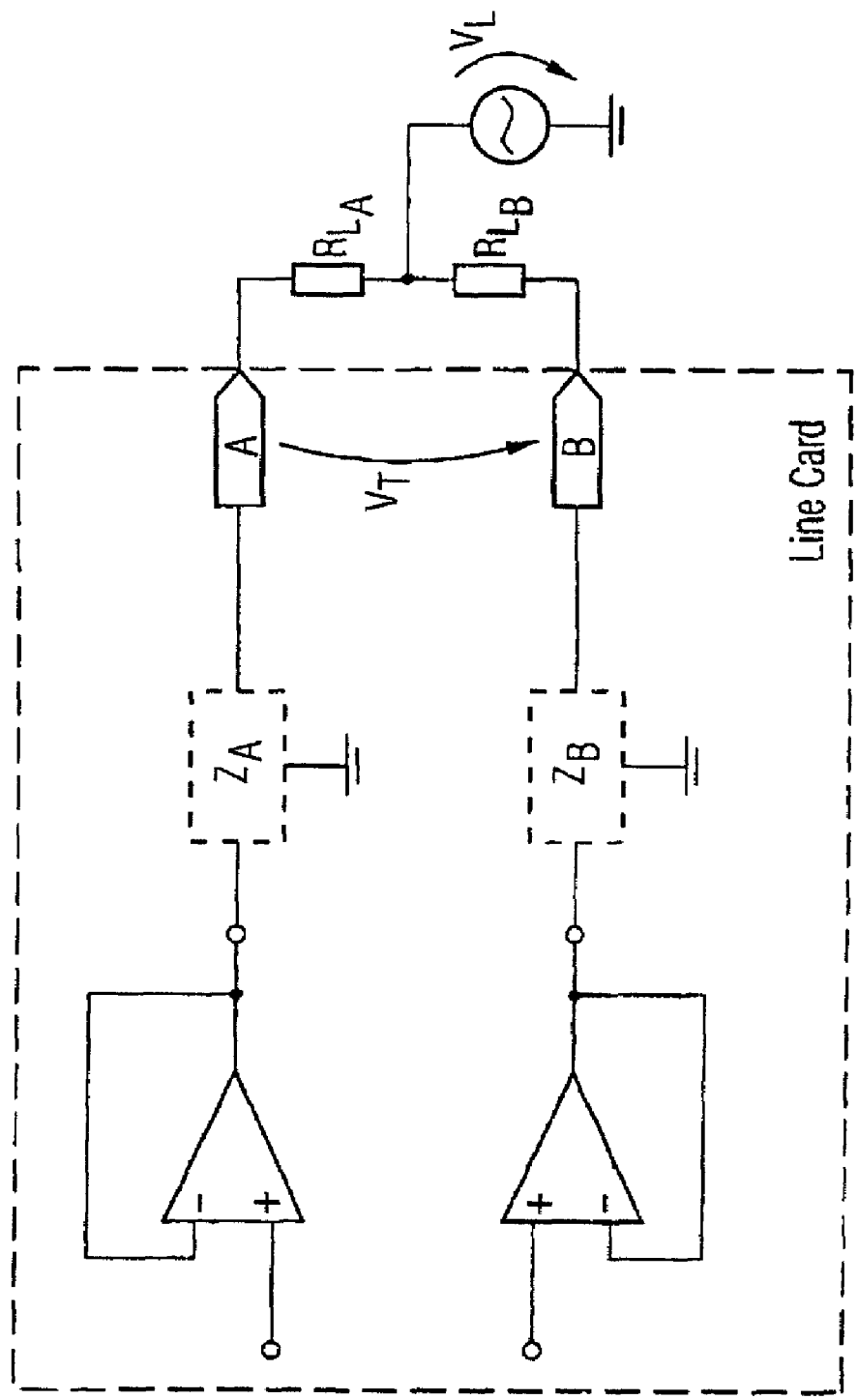
FIG. 3 shows a measuring circuit for measuring the longitudinal conversion loss of a driver circuit according to the prior art.
Figure 4:
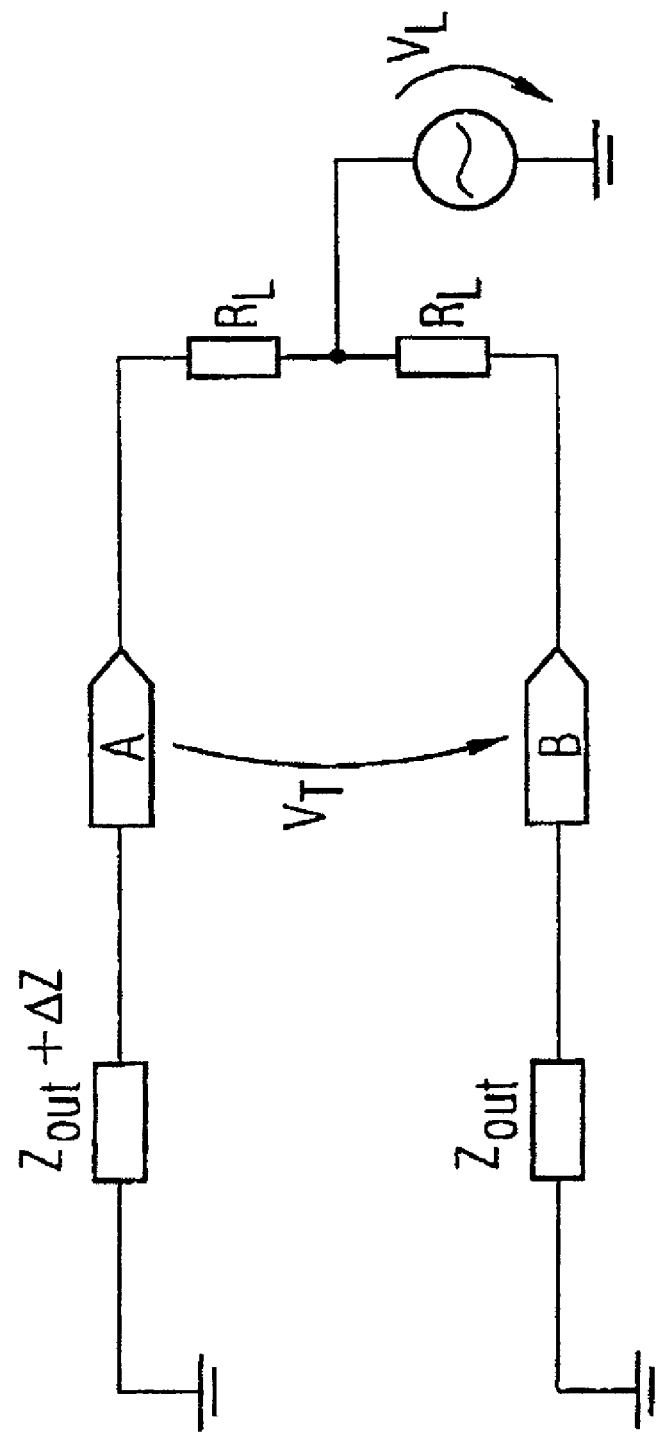
FIG. 4 shows an equivalent circuit diagram for the measuring circuit illustrated in FIG. 3.

FIG. 5 shows a measuring circuit for measuring the longitudinal conversion loss LCL in the driver circuit 1 according to the invention. The driver circuit 1 illustrated in FIG. 5, which is of differential construction, contains two signal inputs 2a, 2b for receiving a useful signal to be driven. The driver circuit 1 furthermore contains two amplifier circuits 3a, 3b in the form of operational amplifiers each having a noninverting input 4a, 4b and an inverting signal input 5a, 5b. The noninverting signal input 4a, 4b is connected to the associated signal input 2a, 2b via a signal line 6a, 6b. The operational amplifier 3a, 3b respectively has a signal output 7a, 7b. The signal output 7a, 7b of the operational amplifier is connected via a line 8a, 8b to a protection impedance 9a, 9b connected downstream. The protection impedance 9a, 9b respectively serves to protect the amplifier circuit 3a, 3b. The protection impedances 9a, 9b are constructed for example as illustrated in FIGS. 2a to 2c. The protection impedances 9a, 9b are connected to the output pads 11a, 11b of the line card 12 via lines 10a, 10b.

In the measuring circuit for measuring the longitudinal conversion loss as illustrated in FIG. 5, the output pads 11a, 11b of the line card 12 are connected to a feed-in signal source 13 via measuring resistors 12a, 12b. The signal source 13 is a voltage source which feeds a sinusoidal measurement signal into the output connections 11a, 11b of the line card 12 via the measuring resistors 12a, 12b.

The driver circuit 1 according to the invention as illustrated in FIG. 5 additionally has electrically constructed feedback circuits 14a, 14b. The feedback circuits 14a, 14b carry out a frequency-dependent signal feedback of the useful signal amplified by the associated amplifier circuit 3a, 23b [sic] to a signal input of the amplifier circuit 3a, 3b. The signal feedback circuits 14a, 14b respectively contain a capacitor 15a, 15b, which is connected between the signal output 7a, 7b of the associated operational amplifier 3a, 3b and a signal input 5a, 5b of the operational amplifier. In the embodiment illustrated in FIG. 5, the useful signal is fed back to the inverting input 5a, 5b of the associated operational amplifier 3a, 3b. In addition, the signal feedback circuits 14a, 14b respectively contain a resistor 16a, 16b, which is connected between the signal line connection 11a, 11b and the inverting signal input 5a, 5b of the operational amplifier 3a, 3b. The signal feedback circuits 14a, 14b of the driver circuit 1 of differential construction each have two inputs 17a, 17b, 18a, 18b. The first input 17a, 17b of the signal feedback circuit 14 is connected to the connecting line 10 between the protection impedance 9 and the signal line connection or pad 11. The second signal input 18 of the signal feedback circuit 14a, 14b is connected to the connecting line 8 between the operational amplifier 3 and the protection impedance 9. The signal feedback circuits 14a, 14b respectively have a signal output 19a, 19b, which is connected to the inverting input 5a, 5b of the associated operational amplifier 3a, 3b via a feedback line 20a, 20b.

The signal feedback circuit 14a, 14b in each case carries out a frequency-dependent signal feedback of the useful signal to the inverting input 5a, 5b of the operational amplifier 3a, 3b. In this case, high-frequency signal components of the useful signal amplified by the amplifier circuit 3a, 3b are fed back to the inverting input 5a, 5b of the operational amplifier 3a, 3b to a greater extent than the low-frequency signal components of the amplified useful signal. As a result of this, the output impedance is reduced in a frequency range up to a limiting frequency $f_{g1}$. The protection impedances 9a, 9b are included in the feedback loop or control loop for low signal frequencies, in particular in a specific signal band, so that the output impedance of the driver circuit is greatly reduced in a low frequency range up to the limiting frequency $f_{g1}$. For high signal frequencies, the feedback loop is closed by means of the capacitors 15a, 15b, so that the feedback is stable.

FIG. 6 shows the differential output impedance of the driver circuit 1 as a function of the frequency. In this case, Z9a, Z9b are the output impedance values of the protection impedances 9a, 9b and A is the open signal gain of the operational amplifiers 3a, 3b. Up to a first limiting frequency $f_{g1}$, the output impedance of the driver circuit according to the invention is reduced by the gain factor A.

The limiting frequency $f_{g1}$ is determined by the capacitance of the capacitor 15 and by the resistance of the resistor 16 of the feedback circuit 14.

$$f_{gl} = \frac{1}{2\pi R_{16} \cdot C_{15}} \qquad (4)$$

As already specified in equation (3), the following holds true for the longitudinal conversion loss LCL:

$$LCL \cong 20 \cdot \log\left|\frac{R_L + Z_{out}}{\Delta Z}\right| \quad (3)$$

The frequency-dependent signal feedback by the signal feedback circuit 14 greatly reduces the output impedance $Z_{out}$ and the impedance difference $\Delta Z$ within the voice band, up to the limiting frequency $f_{g1}$. As emerges from equation (3), this leads to a great increase in the longitudinal conversion loss LCL. Typical values are 80 ohms for the output impedance and 0.5 ohm for the impedance difference. The longitudinal conversion loss LCL is 57.6 dB for this case. If the output impedance $Z_{out}$ and the impedance difference $\Delta Z$ are reduced by the factor A=100 by the feedback circuit 14 according to the invention, a value of 95.6 dB results for the longitudinal conversion loss LCL.

Consequently, in the case of the driver circuit according to the invention, the longitudinal conversion loss LCL can be considerably increased even with the use of inexpensive and inaccurate components on account of frequency-dependent feedback.

| List of reference symbols | |
| --- | --- |
| 1 | Driver circuit |
| 2 | Signal input |
| 3 | Amplifier circuit |
| 4 | Input |
| 5 | Input |
| 6 | Line |
| 7 | Output |
| 8 | Line |
| 9 | Protection impedance |
| 10 | Line |
| 11 | Signal line connection |
| 12 | Measuring resistor |
| 13 | Measurement signal source |
| 14 | Signal feedback circuit |
| 15 | Capacitor |
| 16 | Resistor |
| 17 | Input |
| 18 | Input |
| 19 | Output |
| 20 | Feedback line |

What is claimed is:

1. Driver circuit for driving a useful signal having:
   (a) a signal input for applying a useful signal;
   (b) at least one amplifier circuit with low output impedance for the signal amplification of the useful signal, wherein the amplifier circuit is an operational amplifier having an inverting signal input, a non-inverting signal input and a signal output, wherein one of the signal inputs of the operational amplifier is connected with the signal input for applying the useful signal;
   (c) a protection impedance respectively connected downstream of the amplifier circuit and serving to protect the amplifier circuit, wherein the protection impedance is connected between the signal output of the operational amplifier and a signal line connection for connecting a signal line, wherein the signal line is a telephone line for connecting a telephone to the driver circuit; wherein
   (d) provision is respectively made of a feedback circuit for a frequency-dependent signal feedback of the useful signal amplified by the amplifier circuit; wherein
   (e) the signal feedback circuit respectively has a capacitor, which is connected between the signal output of the operational amplifier and the other one of the signal inputs of the operational amplifier not connected to the useful signal, and a resistor, which is connected between the signal line connection and the signal input of the operational amplifier.

2. Driver circuit according to claim 1, wherein the driver circuit is of differential construction and has two symmetrically constructed amplifier circuits, two symmetrical protection impedances and two symmetrically constructed feedback circuits.

3. Driver circuit according to claim 1, wherein the signal feedback circuit feeds back high-frequency signal components of the useful signal amplified by the amplifier circuit to the signal input of the amplifier circuit to a greater extent than low-frequency signal components of the useful signal amplified by the amplifier circuit, so that the output impedance of the driver circuit is reduced in a specific first frequency range up to a first limiting frequency which lies above the second limiting frequency of the useful signal.

4. Driver circuit according to claim 3, wherein the first frequency range comprises of a second frequency range provided for the transmission of the useful signal.

5. Driver circuit according to claim 4, wherein the second frequency range is a voice signal band for the transmission of a telephone voice signal.

6. Driver circuit according to claim 5, wherein the second limiting frequency of the second frequency range is about 4 kHz.

7. Driver circuit according to claim 1, wherein the signal input of the driver is connected with the noninverting signal input of the operational amplifier and the signal feedback circuit is connected with the inverting signal input of the operational amplifier.

* * * * *